United States Patent
Yashima (10) Patent No.: US 9,153,420 B2
(45) Date of Patent: Oct. 6, 2015

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventor: Jun Yashima, Kanagawa (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/324,530

(22) Filed: Jul. 7, 2014

(65) Prior Publication Data

US 2015/0014549 A1 Jan. 15, 2015

(30) Foreign Application Priority Data

Jul. 10, 2013 (JP) .................................. 2013-144461

(51) Int. Cl.
*H01J 37/00* (2006.01)
*H01J 37/317* (2006.01)
*H01J 37/302* (2006.01)

(52) U.S. Cl.
CPC ......... *H01J 37/3174* (2013.01); *H01J 37/3026* (2013.01); *H01J 2237/31762* (2013.01)

(58) Field of Classification Search
USPC ........ 250/396 R, 397, 492.1, 492.2; 700/1, 2, 700/4, 7
See application file for complete search history.

(56) References Cited

U.S. PATENT DOCUMENTS 7,949,966 B2  5/2011  Anpo et al.
2012/0292537 A1* 11/2012 Yashima et al. ......... 250/492.22

FOREIGN PATENT DOCUMENTS

JP  2008-218767  9/2008

* cited by examiner

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A charged particle beam writing apparatus includes first and second transmission units to perform first and second transmission processing, where, in the first transmission processing, while one of the units performs data transmission processing, the other unit inputs processing data for N processing regions more than pre-set, data-converted, n processing regions, and while one of the units performs data input processing, the other transmits processing data for (N-n) processing regions in order, and in the second transmission processing, processing data for remaining n processing regions are transmitted in order after the first transmission processing, where one of the units starts inputting the processing data while the other performs the first transmission processing, and does not input processing data for a new processing region after starting the second transmission processing.

11 Claims, 8 Drawing Sheets

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2013-144461 filed on Jul. 10, 2013 in Japan, the entire contents of which are incorporated herein by reference.

BACKGROUND OF THE INVENTION

1. Field of the Invention

The present invention relates to a charged particle beam writing apparatus and a charged particle beam writing method.

More specifically, for example, the present invention relates to a writing apparatus and method that performs, in real time, transmission processing of writing data in accordance with advance of writing processing.

2. Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

Figure 8:
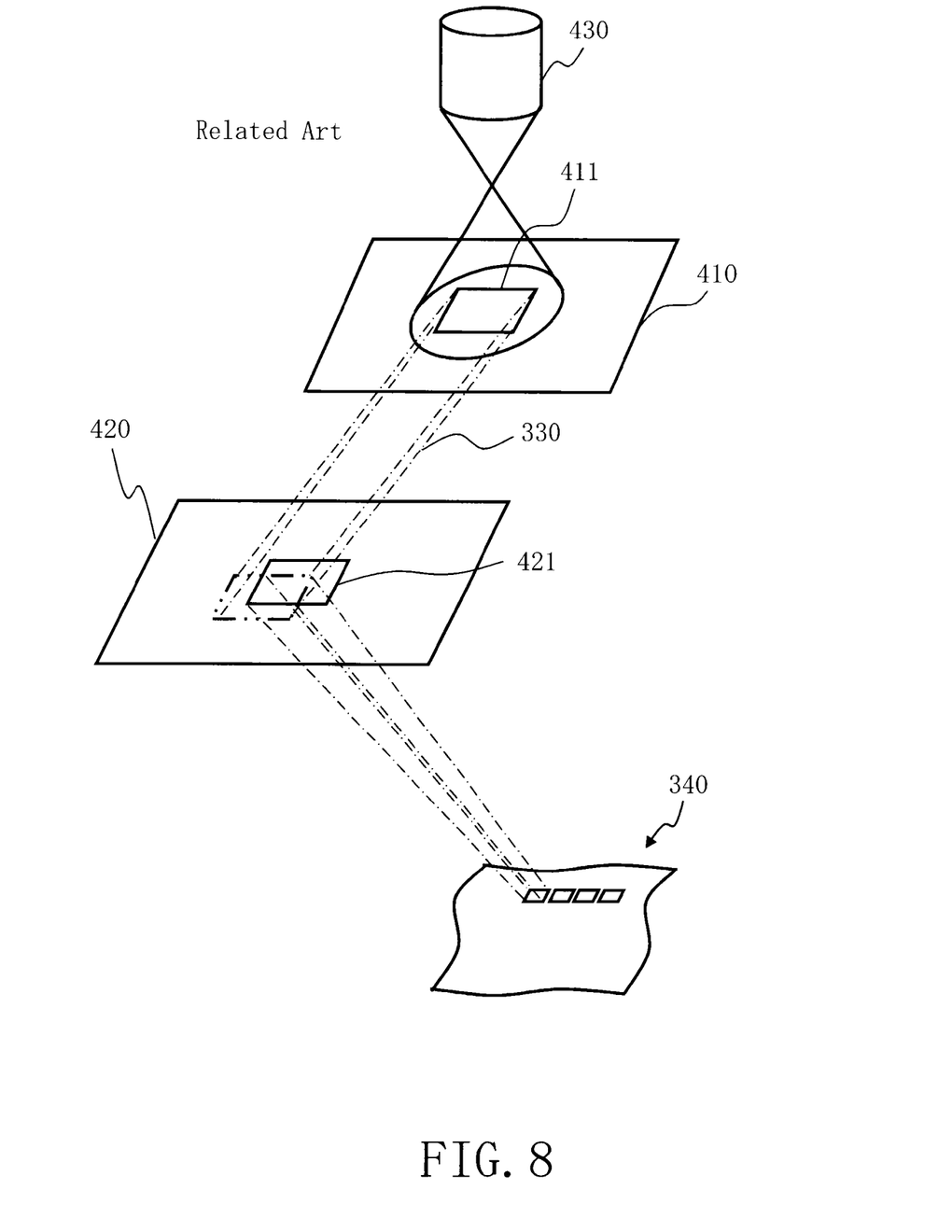
FIG. 8 is a conceptual diagram explaining operations of a variable shaping type electron beam writing apparatus.

FIG. 8 is a conceptual diagram explaining operations of a variable shaping type electron beam writing or "drawing" apparatus. The variable shaping type electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the X direction) during the writing. In other words, a quadrangular shape that can pass through both the aperture 411 and the variable shape aperture 421 is used for pattern writing in a writing region of the target object 340 on the stage continuously moving in the X direction. This method of forming a given shape by letting beams pass through both the aperture 411 of the first aperture plate 410 and the variable shape aperture 421 of the second aperture plate 420 is referred to as a variable shaped beam (VSB) system.

In an electron beam writing apparatus, it is conventionally performed that writing data input from outside the apparatus is divided per predetermined calculation region so as to be allocated to a plurality of computers, and data conversion processing is performed in parallel in a plurality of computers in order to reduce a processing time for data conversion (refer to, e.g., Japanese Patent Application Laid-open (JP-A) No. 2008-218767). Then, data for which data conversion processing has been performed in parallel is once input into a transmission processing device, rearranged in order of writing, and transmitted to a deflection control circuit. Based on such data, the amount of beam deflection is determined so as to irradiate a target object with a deflected beam.

BRIEF SUMMARY OF THE INVENTION

In accordance with one aspect of the present invention, a charged particle beam writing apparatus includes: a plurality of conversion processing units configured to perform data conversion processing in parallel for writing data, for each processing region obtained by virtually dividing a writing region of a target object into a plurality of processing regions; first and second transmission units configured to perform a first transmission processing and a second transmission processing, where, in the first transmission processing, while one of the first and second transmission units is performing data transmission processing, an other one of the first and second transmission units inputs processing data for N processing regions more than pre-set n processing regions for which the data conversion processing has been performed, and while one of the first and second transmission units is performing data input processing, an other one of the first and second transmission units transmits processing data for (N-n) processing regions in order, and in the second transmission processing, processing data for remaining n processing regions are transmitted in order after the first transmission processing has been completed, where when one of the first and second transmission units performs the data input processing, the one starts inputting the processing data while an other one of the first and second transmission units is performing the first transmission processing, and does not input processing data for a new processing region after the second transmission processing has been started; a deflection control circuit configured to control a deflection amount for deflecting a charged particle beam, based on processing data for each processing region transmitted from the first and second transmission units; and a writing unit configured to write a pattern on the target object by deflecting the charged particle beam, based on the deflection amount, wherein the n is set as a first value which is greater than a second value obtained by dividing a time taken for one data input processing from one or more of the plurality of conversion processing units to one of the first and second transmission units by a time taken for transmission of processing data for one processing region from an other one of the first and second transmission units to the deflection control circuit.

In accordance with another aspect of the present invention, a charged particle beam writing apparatus includes: a plurality of conversion processing units configured to perform data conversion processing in parallel for writing data, for each processing region obtained by virtually dividing a writing region of a target object into a plurality of processing regions; first and second transmission units configured to perform transmission processing, where, while one of the first and second transmission units is performing data transmission processing, an other one of the first and second transmission units inputs processing data for pre-set n or more processing regions whose writing processing order is sequential and for which the data conversion processing has been performed, and while one of the first and second transmission units is performing data input processing, an other one of the first and second transmission units transmits processing data for n or more processing regions whose writing processing order is sequential; a deflection control circuit configured to control a deflection amount for deflecting a charged particle beam, based on processing data for each processing region transmitted in order from the first and second transmission units; and a writing unit configured to write a pattern on the target object by deflecting the charged particle beam, based on the deflection amount, wherein the n is set as a first value which is greater than a second value obtained by dividing time taken for one data input processing from one or more of the plurality of conversion processing units to one of the first and second transmission units by a time taken for transmission of processing data for one processing region from an other one of the first and second transmission units to the deflection control circuit.

Moreover, in accordance with another aspect of the present invention, a charged particle beam writing method includes: performing data conversion processing in parallel for writing data for each processing region obtained by virtually dividing a writing region of a target object into a plurality of processing regions, by using a plurality of conversion processing units; inputting processing data for $N_1$ processing regions more than pre-set n processing regions for which the data conversion processing has been performed, by a first transmission unit; transmitting data to a deflection control circuit, where the transmitting includes a first transmission processing of transmitting processing data for ($N_1$-n) processing regions in order, and a second transmission processing of transmitting processing data for remaining n processing regions in order after the first transmission processing has been completed, by the first transmission unit; starting inputting processing data for $N_2$ processing regions more than pre-set n processing regions, for which the data conversion processing has been performed, while the first transmission processing is being performed by the first transmission unit, where the inputting is controlled not to input processing data for a new processing region after the second transmission processing has been started, by a second transmission unit; transmitting data to the deflection control circuit, where the transmitting includes a first transmission processing of transmitting processing data for ($N_2$-n) processing regions in order after the second transmission processing by the first transmission unit has been completed, and a second transmission processing of transmitting processing data for remaining n processing regions in order after the first transmission processing has been completed, by the second transmission unit; and writing a pattern on the target object by deflecting a charged particle beam, based on processing data for each processing region transmitted from the first and second transmission units, wherein the n is set as a first value which is greater than a second value obtained by dividing time taken for one data input processing from one or more of the plurality of conversion processing units to one of the first and second transmission units by a time taken for transmission of processing data for one processing region from an other one of the first and second transmission units to the deflection control circuit.

DETAILED DESCRIPTION OF THE INVENTION

In an electron beam writing apparatus, operations are alternately repeated, for example, by using two transmission processing devices. Specifically, while one transmission processing device is inputting data having been converted, the other one transmits data having been input, to a deflection control circuit. Thereby, data transmission to the deflection control circuit is performed uneventfully and thus writing processing is advanced smoothly. Here, however, there occurs a problem in that, if data transmission from the transmission processing device to the deflection control circuit is delayed, writing processing cannot be performed smoothly.

As an example of the problem, there is a case where the buffer in the deflection control circuit does not have a large storage capacity. In such a case, since it is impossible to transmit data for many calculation regions in advance, data transmission needs to be performed one by one according to advance of writing processing. For example, relative to a time taken for input processing performed once by one transmission processing device (first transmission processing device), if the amount of data transmitted from the other transmission processing device (second transmission processing device) to the deflection control circuit is small, data inputting of the first transmission processing device may not have been completed by the end of data transmission of the second transmission processing device. As a result, it leads to that data transmission processing to be performed next by the first transmission processing device does not proceed smoothly. Consequently, data transmission from the transmission processing device to the deflection control circuit is delayed, and thus the writing processing is not performed uneventfully.

As another example of the problem, there is a case where when the first transmission processing device performs data input while the second transmission processing device is transmitting data, if the buffer in the first transmission processing device still has storage capacity available when the planned first-time input processing has been finished, the second-time input processing is started. In such a case, if the second-time data inputting of the first transmission processing device has not been completed by the end of data transmission of the second transmission processing device, it leads to that data transmission processing to be performed next by the first transmission processing device does not proceed smoothly. Consequently, data transmission from the transmission processing device to the deflection control circuit fails to be completed within a limited time, and thus writing processing does not proceed smoothly.

In the embodiments described below, a writing apparatus and method that can smoothly transmit data to a deflection control circuit and perform writing processing uneventfully will be explained.

In the following embodiments, there will be described a configuration in which an electron beam is used as an example of a charged particle beam. The charged particle beam is not limited to the electron beam, and other charged particle beam such as an ion beam may also be used. Moreover, a variable shaping type electron beam writing apparatus will be described as an example of a charged particle beam apparatus.

First Embodiment

Figure 1:
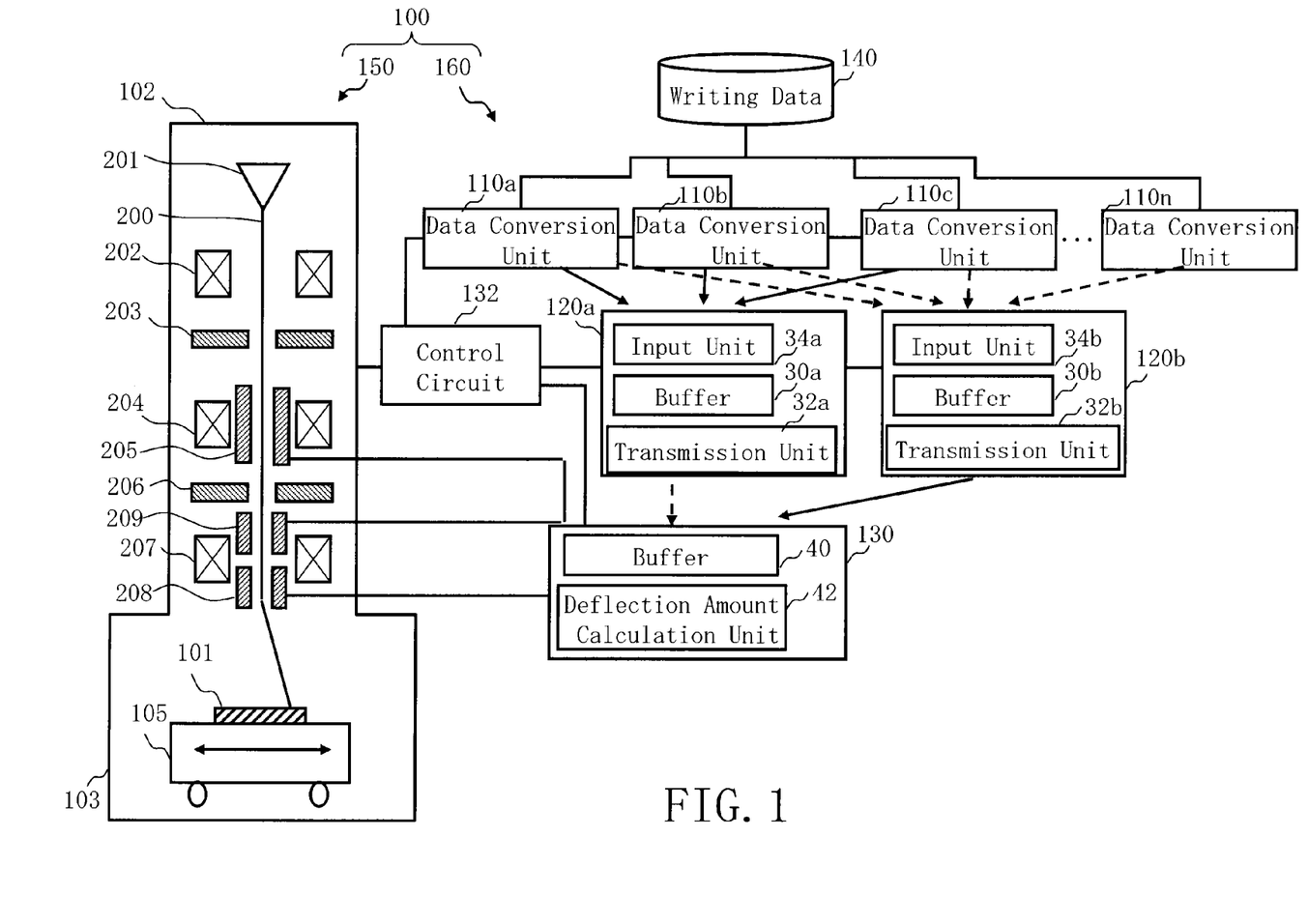
FIG. 1 is a schematic diagram showing a configuration of a writing apparatus according to the first embodiment.

FIG. 1 is a schematic diagram showing a configuration of a writing apparatus according to the first embodiment. As shown in FIG. 1, a writing (or "drawing") apparatus 100 includes a writing unit 150 and a control unit 160. The writing apparatus 100 is an example of a charged particle beam writing apparatus. Particularly, it is an example of a variable shaping type electron beam writing apparatus. The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a main deflector 208 and a sub-deflector 209. In the writing chamber 103, there is arranged an XY stage 105. On the XY stage 105, a target object or "sample" 101 such as a mask serving as a writing target is placed when performing writing. The target object 101 is, for example, an exposure mask used for manufacturing semiconductor devices. The target object 101 may be, for example, a mask blank on which resist is applied and a pattern has not yet been formed.

The control unit 160 includes a plurality of control computer units 110a to n, a plurality of data transmission computer units 120a and b, a deflection control circuit 130 (deflection calculation unit), a control circuit 132, and a storage device 140 such as a magnetic disk drive. The plurality of control computer units 110a to n, the plurality of data transmission computer units 120a and b, the deflection control circuit 130, the control circuit 132, and the storage device 140 are mutually connected through a bus (not shown).

In each of a plurality of control computer units 110a to n, there are arranged a plurality of CPUs and a plurality of memories. In each of a plurality of data transmission computer units 120a and b, there are arranged an input unit 34, a buffer memory 30, and a transmission unit 32. In the deflection control circuit 130, there are arranged a buffer memory 40 and a deflection amount calculation unit 42.

FIG. 1 shows a configuration necessary for explaining the first embodiment. Other configuration elements generally necessary for the writing apparatus 100 may also be included. For example, a multiple stage deflector of two stages of the main deflector 208 and the sub deflector 209 is herein used for position deflection, but however, a single stage deflector or a multiple stage deflector of three or more stages may also be used for position deflection.

Writing data in which positions, sizes and the like of a plurality of figure patterns are defined is input into the storage device 140 from the outside to be stored therein.

Figure 2:
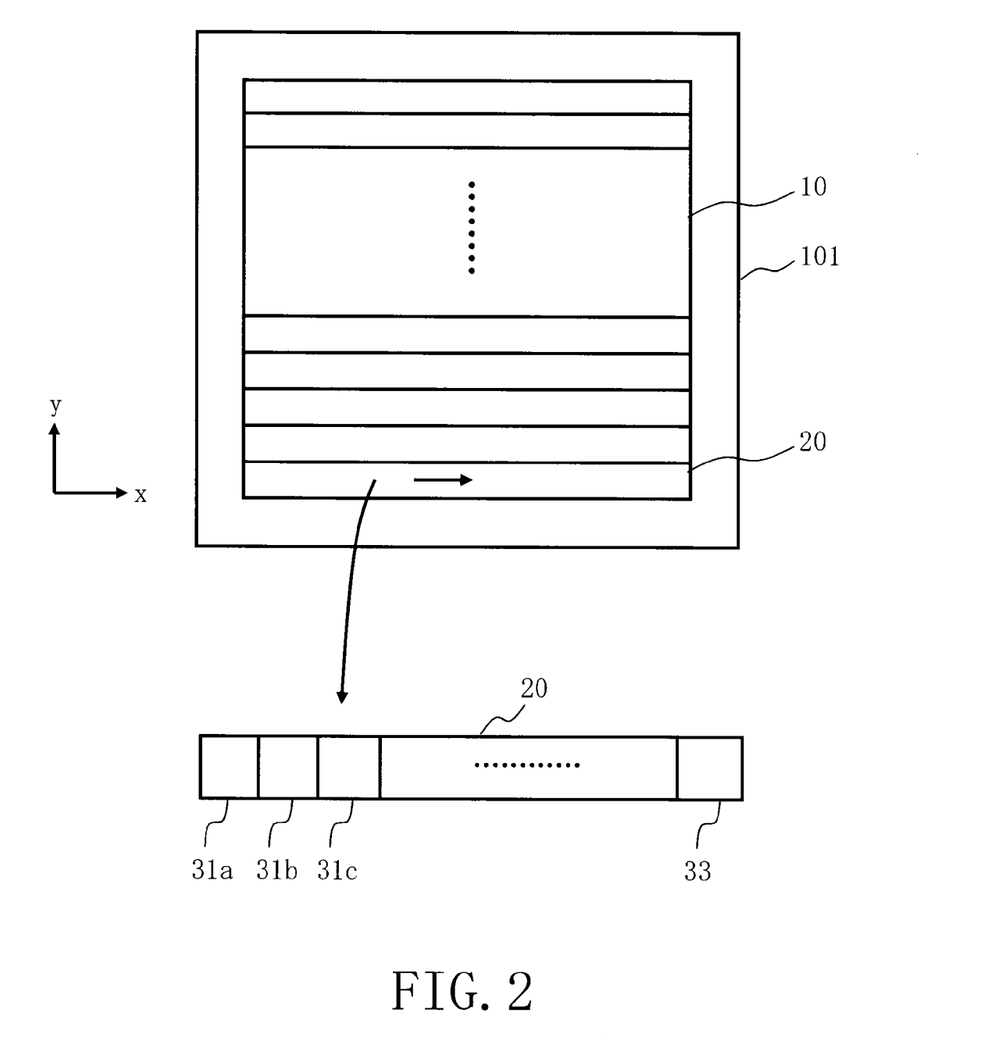
FIG. 2 shows a conceptual diagram explaining each region according to the first embodiment.

FIG. 2 shows a conceptual diagram explaining each region according to the first embodiment. In FIG. 2, a writing region 10 of the target object 101 is virtually divided into a plurality of strip-shaped stripe regions 20 each having a width being able to be deflected in the x or y direction by the main deflector 208. Moreover, each stripe region 20 is divided into a plurality of block-shaped calculation processing unit regions (DPB) 31.

Figure 3:
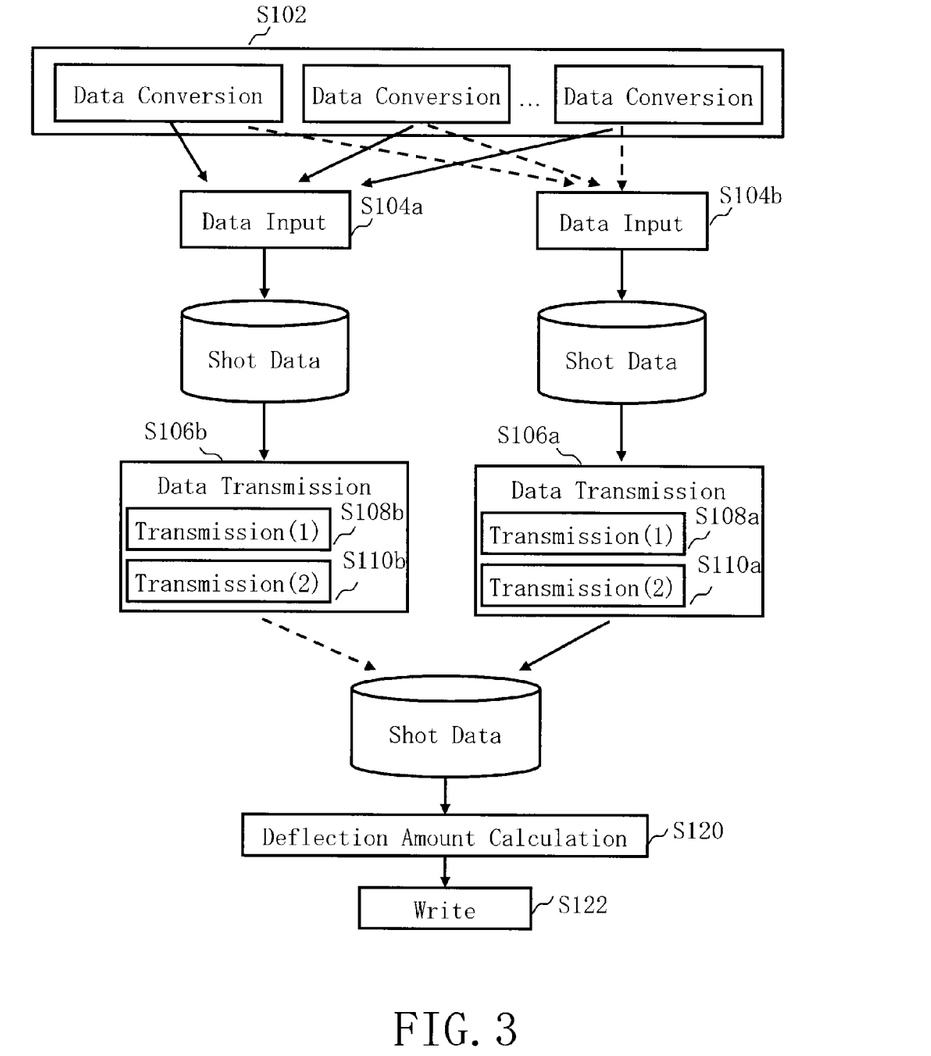
FIG. 3 is a flowchart showing main steps of a writing method according to the first embodiment.

FIG. 3 is a flowchart showing main steps of a writing method according to the first embodiment. In FIG. 3, the writing method according to the first embodiment executes a series of steps as an example: a data conversion step (S102), a data input step (S104), a data transmission step (S106), a deflection amount calculation step (S120), and a writing step (S122). A data input step (S104a) and a data transmission step (S106a) are executed in parallel. A data input step (S104b) and a data transmission step (S106b) are executed in parallel. The data transmission step (S106a) executes, as internal steps, a transmission processing (1) step (S108a) and a transmission processing (2) step (S110a). The data transmission step (S106b) executes, as internal steps, a transmission processing (1) step (S108b) and a transmission processing (2) step (S110b).

In the data conversion step (S102), a plurality of control computer units 110a to n (an example of a data conversion unit or a conversion processing unit) perform data conversion processing of writing data in parallel for each DPB region 31 obtained by virtually dividing the writing region 10 of the target object 101 into a plurality of DPB regions 31 (processing regions).

Each CPU in a plurality of control computer units 110a to n reads corresponding writing data per DPB region 31 unit from the storage device 140, performs data conversion processing of a plurality of steps, and generates apparatus-specific shot data. Thus, by performing data processing in parallel, the data processing can be executed at a high speed. For actually writing a figure pattern by the writing apparatus 100, it is necessary to divide each figure pattern defined in writing data into the size that can be irradiated by one beam shot. Then, the CPU in each of a plurality of data conversion units 110a to n generates a shot figure by dividing a figure pattern indicated by writing data into the size that can be irradiated by one beam shot. Shot data is generated for each shot figure. In the shot data, there is defined figure data, such as a figure type, a figure size, an irradiation position and a dose, for example. Further, according to the first embodiment, writing order information indicating a writing order is defined as a header of each shot data.

Writing order information is placed in the header of each shot data. For example, DPB information is defined, and then, a writing order is represented by the DPB information. For example, when DPB information is defined for each stripe region 20, further, stripe region information is also defined. It is preferable to use, for example, a DPB address as the DPB information. Writing processing is performed for each DPB in order of increasing position indicated by the address from the smallest, for example. Alternatively, writing processing is performed for each DPB in order of increasing distance of the position indicated by the address from the closest to the writing starting position of each stripe region, for example. Alternatively, it is also preferable to define a number for each of a plurality of DPBs such that each number indicates the order of writing processing of a DPB concerned.

Then, figure data, such as a figure type, a figure size, an irradiation position, and a dose, is defined after the header. Shot data calculated by the CPU in each of the data conversion units 110a to n is stored in a memory corresponding to each CPU.

The data transmission computer units 120a and b alternately perform data input (inputting shot data) and data transmission (transmitting shot data) repeatedly. Thus, the data transmission computer units 120a and b do not simultaneously perform data input, nor they do not simultaneously perform data transmission. Therefore, while one of the two data transmission computer units 120a and b (e.g., the data transmission computer unit 120a) is performing data input, the other one (e.g., the data transmission computer unit 120b) performs data transmission to the deflection control circuit 130. After the other one (e.g., the data transmission computer unit 120b) finishes the data transmission, and then, while one (e.g., the data transmission computer unit 120b) is performing data input, the other one (e.g., the data transmission computer unit 120*a*) performs data transmission to the deflection control circuit 130. This operation is repeatedly performed. By such a repetitive operation, data transmission to the deflection control circuit 130 should be performed uneventfully. However, there is a problem that data transmission to the deflection control circuit 130 fails to be completed within a limited time, and thus writing processing does not proceed smoothly.

Figure 4:
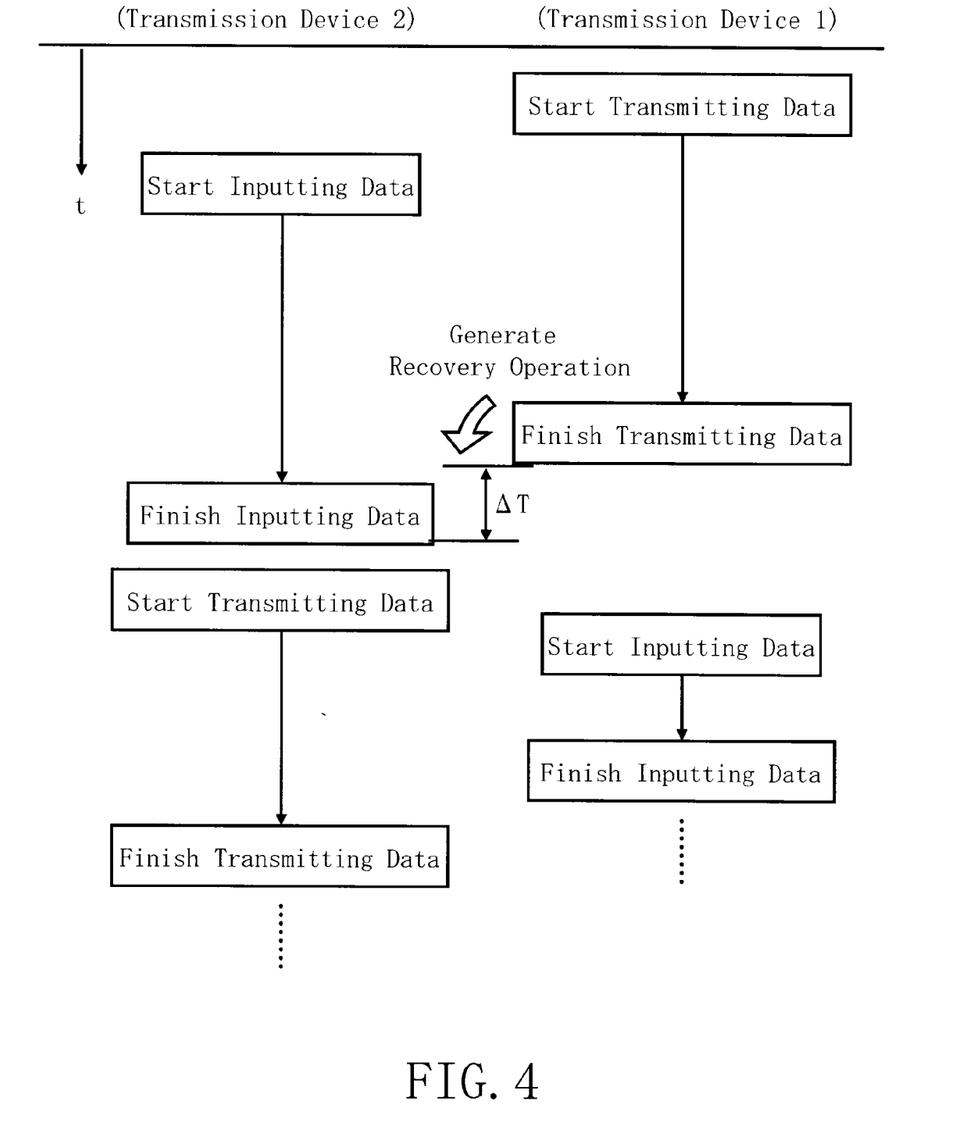
FIG. 4 shows an example of a time chart of data input and data transmission according to a comparative example.

FIG. 4 shows an example of a time chart of data input and data transmission according to a comparative example. When the buffer in the deflection control circuit does not have a large storage capacity, since it is impossible to transmit processing data for many DPB regions in advance, data transmission needs to be performed one by one in accordance with advance of writing processing. For example, after starting data transmission by the data transmission computer unit 120*a* (transmission device 1), data input is started by the data transmission computer unit 120*b* (transmission device 2). However, for example, relative to a time taken for input processing performed once by the data transmission computer unit 120*b*, if the amount of data transmitted from the data transmission computer unit 120*a* to the deflection control circuit 130 is small, data inputting of the data transmission computer unit 120*b* is not completed by the end of data transmission of the data transmission computer unit 120*a*. Therefore, as shown in FIG. 4, a time lag of time ΔT occurs between the end of data transmission of the data transmission computer unit 120*a* and the end of data input of the data transmission computer unit 120*b*. Due to generation of the stagnation time, a recovery operation is to be performed in the writing apparatus 100. In other words, writing processing is stopped once and the stage is returned back to the just previous position, and then, processing is restarted again after waiting for arrival of data. Thus, the writing processing is stagnated because of the time for the recovery operation.

Figure 5:
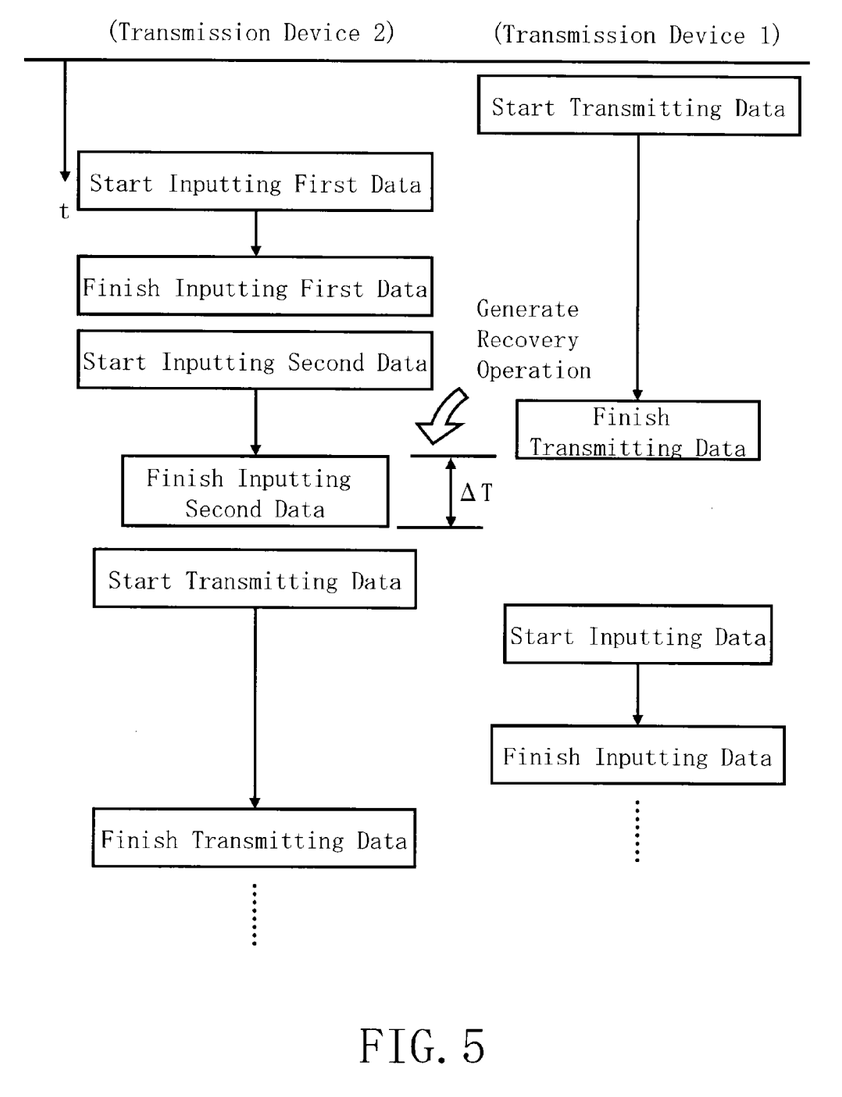
FIG. 5 shows another example of the time chart of data input and data transmission according to a comparative example.

FIG. 5 shows another example of the time chart of data input and data transmission according to a comparative example. FIG. 5 shows the case where when the data transmission computer unit 120*b* (transmission device 2) performs data input while the data transmission computer unit 120*a* (transmission device 1) is transmitting data, since the buffer in the data transmission computer unit 120*b* still has storage capacity available when the planned first-time input processing (input processing of the first data) has been finished, the second-time input processing (input processing of the second data) is started. In such a case, if the second-time data inputting of the data transmission computer unit 120*b* has not been completed by the end of data transmission of the data transmission computer unit 120*a*, it leads to that data transmission processing to be performed next by the data transmission computer unit 120*b* does not proceed smoothly. Therefore, as shown in FIG. 5, a time lag of time ΔT occurs between the end of data transmission of the data transmission computer unit 120*a* and the end of the second data input of the data transmission computer unit 120*b*. Due to generation of the stagnation time, a recovery operation is to be performed in the writing apparatus 100. Consequently, data transmission from the data transmission computer unit 120*b* to the deflection control circuit 130 fails to be completed within a limited time, and thus writing processing does not proceed smoothly.

Then, according to the first embodiment, the time taken for one data input processing by each data transmission computer unit 120 and the time taken for transmission of processing data (shot data) for one DPB region 31 to the deflection control circuit 130 from each data transmission computer unit 120 are taken into consideration. The time taken for one data input processing by each data transmission computer unit 120 is t1 (sec). Such an input processing time can be constant regardless of the number of input DPBs because processing data of a plurality of DPB regions 31 can be input in parallel. On the other hand, since the time taken for transmission of processing data when transmitting from each data transmission computer unit 120 to the deflection control circuit 130 is t2 (sec/DPB) per DPB region 31 because the data transmission is a serial transmission (series transmission) for each DPB region 31. Therefore, if performing data input and data transmission of processing data for "n" (being an integer) DPB regions 31, where the integer "n" is greater than or equal to a value obtained by dividing a time t1 (sec) taken for one data input processing from one or more control computer units 110*a* to *n* to one of the data transmission computer units 120*a* and *b* by a time t2 (sec/DPB) taken for transmission of processing data for one DPB region 31 from the other one of the data transmission computer units 120*a* and *b* to the deflection control circuit 130, the data input is not delayed with respect to the data transmission. Therefore, transmission processing of writing data can be performed in real time in accordance with advance of writing processing.

Then, in order not to stagnate subsequent writing processing, processing data for n or more DPB regions 31 are made to be processing data for a plurality of DPB regions 31 whose writing processing order is sequential. It is preferable to set the integer n to be an integer calculated by rounding up a value after the decimal point of t1/t2.

Now, there will be explained the case according to the first embodiment in which the data transmission computer units 120*a* and *b* each perform data input and data transmission of processing data for N DPB regions 31, where N is greater than n. That is, for example, N DPB regions 31, for which data input and data transmission of processing data is performed by the data transmission computer units 120*a* and *b*, shall be more than n DPB regions 31. The value N in each of the data transmission computer units 120*a* and 120*b* may be the same or different from each other. For example, the same number N may be used for the data transmission computer units 120*a* and 120*b*, or the number $N_1$ may be used for the data transmission computer units 120*a* and the number $N_2$ may be used for the data transmission computer units 120*b*. Moreover, the N value may vary whenever the data transmission computer unit 120*a* performs data input. For example, N varies such as $N_1$, $N_3$, and so on. Similarly, the N value may vary whenever the data transmission computer unit 120*b* performs data input. For example, N varies such as $N_2$, $N_4$, and so on.

In the data input step (S104*a*), the data transmission computer unit 120*a* (first transmission unit) inputs processing data (shot data) for N DPB regions 31 that is more than pre-set n DPB regions 31 for which data conversion processing has been performed. Here, the input unit 34*a* of the data transmission computer unit 120*a* (first transmission unit) inputs processing data for N DPB regions 31 that is more than pre-set n DPB regions 31 for which data conversion processing has been performed. The input processing data for N DPB regions 31 is stored in a buffer memory 30*a*. The preset value "n" is the above-described n that is an integer greater than or equal to t1/t2.

Figure 6:
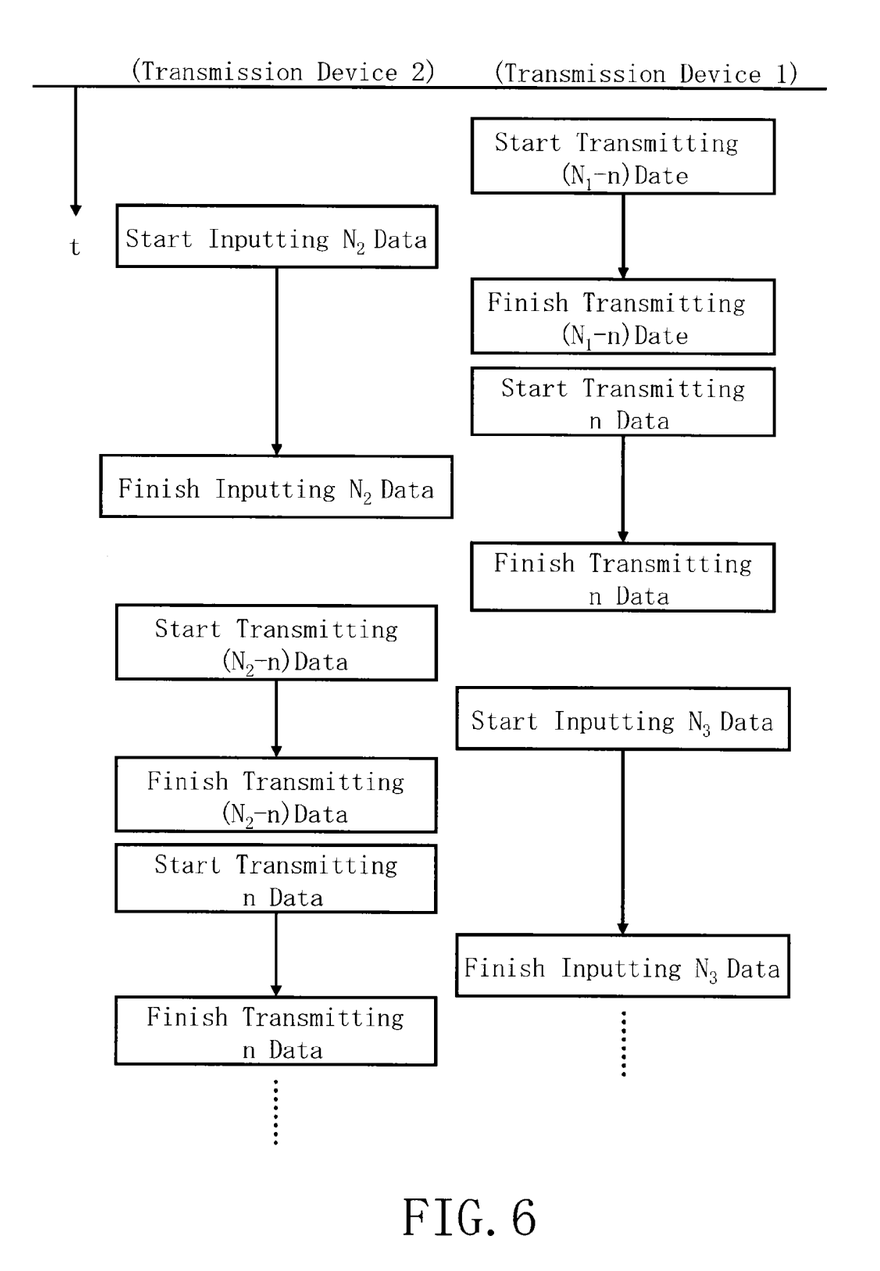
FIG. 6 shows an example of a time chart of data input and data transmission according to the first embodiment.

FIG. 6 shows an example of the time chart of data input and data transmission according to the first embodiment. In the data transmission step (S106*b*), the data transmission computer unit 120*a* (first transmission unit) executes, as internal steps, a transmission processing (1) step (S108*b*) and a transmission processing (2) step (S110*b*).

First, in the transmission processing (1) step (S108*b*) (first transmission processing), the transmission unit 32*a* transmits processing data for ($N_1$-n) DPB regions in order to the deflection control circuit 130. After finishing the transmission processing (1) step (S108b), next, in the transmission processing (2) step (S110b) (second transmission processing), the transmission unit 32a transmits processing data for the remaining n DPB regions in order. The transmitted processing data (shot data) is temporarily stored in the buffer memory 40.

In the data input step (S104b), while the data transmission computer unit 120a is performing the transmission processing (1) step (S108b), the input unit 34b of the data transmission computer unit 120b (second transmission unit) starts inputting the processing data for $N_2$ DPB regions that is more than pre-set n DPB regions 31 for which data conversion processing has been performed. Then, the input unit 34b does not input processing data for a new DPB region any more after starting the transmission processing (2) step (S110b) by the data transmission computer unit 120a. Since the transmission time taken in the transmission processing (2) step (S110b) is time (n×t2≥t1) to transmit processing data for n DPB regions, it is possible for the data transmission computer unit 120b to complete at least one data input (to input processing data for $N_2$ DPB regions) of the data input time t1 during the time (n×t2≥t1). Therefore, the data transmission computer unit 120b can complete data input of processing data for $N_2$ DPB regions by the end of data transmission of the data transmission computer unit 120a.

Then, in the data transmission step (S106a), the data transmission computer unit 120b (second transmission unit) executes, as internal steps, a transmission processing (1) step (S108a) and a transmission processing (2) step (S110a). Specifically, in the transmission processing (1) step (S108a) (first transmission processing), the transmission unit 32b transmits, in order, processing data for ($N_2$-n) DPB regions to the deflection control circuit 130. After finishing the transmission processing (1) step (S108a), in the transmission processing (2) step (S110a) (second transmission processing), the transmission unit 32b transmits processing data for the remaining n DPB regions in order. The transmitted processing data (shot data) is temporarily stored in the buffer memory 40.

In the data input step (S104a), while the data transmission computer unit 120b is performing the transmission processing (1) step (S108a), the input unit 34a of the data transmission computer unit 120a (first transmission unit) starts inputting the processing data for $N_3$ DPB regions that is more than pre-set n DPB regions 31 for which data conversion processing has been performed. Then, the input unit 34a does not input processing data for a new DPB region any more after starting the transmission processing (2) step (S110a) by the data transmission computer unit 120b. Since the transmission time taken in the transmission processing (2) step (S110a) is time (n×t2≥t1) to transmit processing data for n DPB regions, it is possible for the data transmission computer unit 120a to complete at least one data input (to input processing data for $N_3$ DPB regions) of the data input time t1 during the time (n×t2≥t1). Therefore, the data transmission computer unit 120a can complete data input of processing data for N DPB regions by the end of data transmission of the data transmission computer unit 120b.

As described above, while one of the data transmission computer units 120a and 120b is performing data transmission, the other one inputs processing data for N DPB regions that is more than pre-set n DPB regions 31 for which data conversion processing has been performed, where N may be variable each time, such as $N_1, N_2, N_3, \ldots$. Then, while one of the data transmission computer units 120a and 120b is performing data input processing, the other one performs two data transmission processing of the first transmission processing and the second transmission processing, where the first transmission processing indicates to transmit processing data for (N-n) DPB regions in order, and the second transmission processing indicates to transmit processing data for the remaining n DPB regions in order after the first transmission processing. When one of the data transmission computer units 120a and 120b performs data input processing, the one starts inputting processing data while the other one is performing the first transmission processing, and the one does not input processing data for a new DPB region any more after the second transmission processing is started.

As described above, the parallel processing of the data input step (S104a) and the data transmission step (S106a), and the parallel processing of the data input step (S104b) and the data transmission step (S106b) are repeated. Consequently, shot data of the DPB regions 31 in a writing processing order can be stored in the buffer memory 40 of the deflection control circuit 130 without any delay.

In the deflection amount calculation step (S120), the deflection amount calculation unit 42 reads processing data (shot data) from the buffer memory 40 in order of writing, and calculates deflection amounts to be deflected by the deflector 205, the main deflector 208, and the sub deflector 209 respectively. A digital signal indicating a deflection amount is output to the digital-analog conversion (DAC) amplifier unit (not shown) for each deflector. Then, in each DAC amplifier (not shown), the digital signal output from the deflection control circuit 130 is converted to an analog signal and amplified to be applied as a deflection voltage to the deflector 205, the main deflector 208, or the sub deflector 209. Thus, the deflection control circuit 130 controls a deflection amount for deflecting an electron beam 200, based on processing data for each DPB region 31 transmitted from the data transmission computer units 120a and 120b.

In the writing step (S122), the writing unit 150 controlled by the control circuit 132 writes a pattern on the target object 101 by deflecting the electron beam 200 based on the deflection amount. Specifically, it operates as follows.

The electron beam 200 emitted from the electron gun 201 (emission unit) irradiates the whole of the first aperture plate 203 having a quadrangular opening by the illumination lens 202. At this point, the electron beam 200 is shaped to be a quadrangle. Then, after having passed through the first aperture plate 203, the electron beam 200 of the first aperture image is projected onto the second aperture plate 206 by the projection lens 204. The first aperture image on the second aperture plate 206 is deflected and controlled by the deflector 205 so as to change the shape and size of the beam to be variably shaped. After having passed through the second aperture plate 206, the electron beam 200 of the second aperture image is focused by the objective lens 207, and deflected by the main deflector 208 and the sub deflector 209 to reach a desired position on the target object 101 placed on the XY stage 105 which moves continuously. FIG. 1 shows the case of using multiple stage deflection of the main and sub deflection for position deflection. In such a case, the main deflector 208 may deflect the electron beam 200 of a shot concerned to a reference position in a subfield (SF), which is obtained by virtually dividing the writing region of the target object by the main deflector 208, while following the movement of the stage, and the sub deflector 209 may deflect the shot beam concerned to each irradiation position in the SF.

The writing processing is performed for each stripe region 20. It is preferable for the data transmission computer units 120a and 120b, for each stripe region 20, to stop data input processing once when inputting the processing data for a DPB region 33 at the end of the stripe region 20 concerned is completed. A flag which indicates being the end should be defined in the processing data of the DPB region 33. If detecting the flag indicating being the end, the input units 34a and 34b should finish input processing when the input processing of the data including the flag is completed. When transmitting the processing data of the DPB region 33 at the end of the stripe region 20, the data transmission computer units 120a and 120b each perform transmission processing even if the number of the input processing data is less than n. In that case, the processing data, whose number is less than n, should be transmitted by one transmission processing. Thereby, the writing processing can be advanced to the end of the stripe.

In the next stripe region 20, writing of the first DPB region 31 is not immediately started. This is because that after inputting N data at the data input step (S104a) in the next stripe region 20, and completing the data transmission step (S106a), it can proceed to the subsequent steps, namely the change amount calculation step (S120) and the writing step (S122). Therefore, the time taken for the data input step (S104a) and the data transmission step (S106a) delays the start of writing. However, since it is possible to overlap the time taken for the data input and the data transmission with the time for moving the XY stage 105 from the position for the written stripe region 20 to the position for making the head of the next stripe region 20 be within the deflection range of a beam, writing start can be advanced due to the overlapping. Consequently, it can be finished within a time shorter than the case of performing recovery. After completing input processing of the processing data for the DPB region 33 at the end, if the buffer memories 30a and b still have sufficient storage capacity available to store processing data for DPB regions whose write processing order is sequential of the next stripe region 20 in addition to the processing data having already been input, wherein the total number of the processing data should be N, data inputting may be performed again after once stopping (finishing) the previous data input step. In that case, writing start of the next stripe region 20 can be advanced.

In the example described above, each of the data transmission computer units 120a and 120b inputs and transmits processing data for N DPB regions that is more than pre-set n DPB regions, but however it is not limited thereto. Each of the data transmission computer units 120a and 120b may input and transmit processing data for pre-set n DPB regions whose writing processing order is sequential. In that case, it is not necessary to divide the transmission processing into two transmission processing, in the data transmission step (S106).

Figure 7:
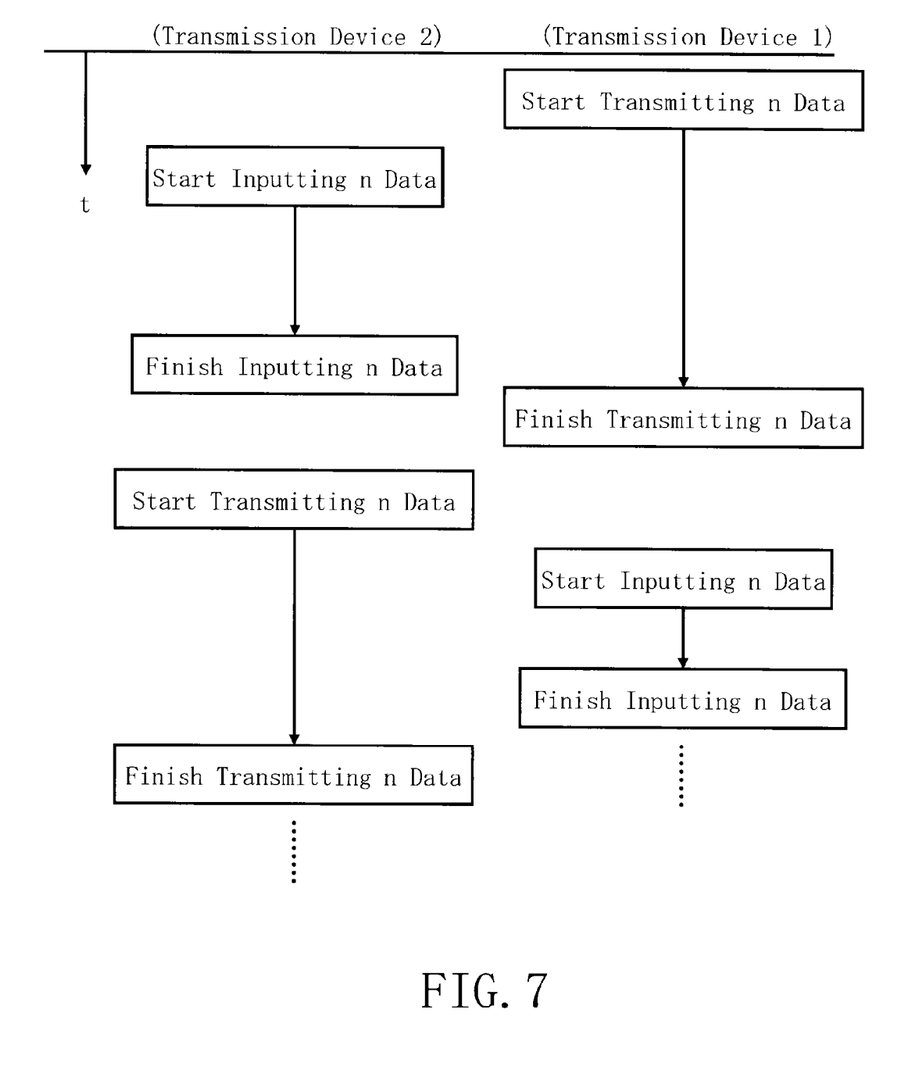
FIG. 7 shows another example of the time chart of data input and data transmission according to the first embodiment.

FIG. 7 shows another example of the time chart of data input and data transmission according to the first embodiment. FIG. 7 shows subsequent processing after completing to input processing data for n DPB regions, whose writing processing order is sequential, in the buffer memory 30a of the data transmission computer unit 120a (transmission device 1).

In the data transmission step (S106b), the transmission unit 32a of the data transmission computer unit 120a (first transmission unit) starts transmission processing of transmitting in order the processing data for n DPB regions whose writing processing order is sequential to the deflection control circuit 130. The transmitted processing data (shot data) is temporarily stored in the buffer memory 40.

In the data input step (S104b), while the data transmission computer unit 120a is performing data transmission processing, the input unit 34b of the data transmission computer unit 120b (second transmission unit) starts inputting the processing data for pre-set n DPB regions 31 whose writing processing order is sequential and for which data conversion processing has been performed. Since the transmission time taken in the transmission processing step (S110b) is the time ($n \times t2 \geq t1$) to transmit processing data for n DPB regions, it is possible for the data transmission computer unit 120b to complete at least one data input (to input processing data for n DPB regions) of the data input time t1 during the time ($n \times t2 \geq t1$). Therefore, the data transmission computer unit 120b can complete data input of processing data for n DPB regions by the end of data transmission of the data transmission computer unit 120a.

Then, in the data transmission step (S106a), the transmission unit 32b of the data transmission computer unit 120b (second transmission unit) transmits, in order, processing data for n DPB regions whose writing processing order is sequential to the deflection control circuit 130. The transmitted processing data (shot data) is temporarily stored in the buffer memory 40.

In the data input step (S104a), while the data transmission computer unit 120b is performing the data transmission step (S106a), the input unit 34a of the data transmission computer unit 120a (first transmission unit) starts inputting the processing data for pre-set n DPB regions 31 whose writing processing order is sequential and for which data conversion processing has been performed. Since the transmission time taken in the data transmission step (S106a) is the time ($n \times t2 \geq t1$) to transmit processing data for n DPB regions, it is possible for the data transmission computer unit 120a to complete at least one data input (to input processing data for n DPB regions) of the data input time t1 during the time ($n \times t2 \geq t1$). Therefore, the data transmission computer unit 120a can complete data input of processing data for n DPB regions whose writing processing order is sequential by the end of data transmission of the data transmission computer unit 120b.

As described above, according to the first embodiment, while one of the data transmission computer units 120a and 120b is performing data transmission, the other one inputs processing data for pre-set n or more DPB regions 31 whose writing processing order is sequential and for which data conversion processing has been performed. Thus, while one of the data transmission computer units 120a and 120b is performing data input processing, the other one transmits processing data for n or more DPB regions 31 whose writing processing order is sequential. By this configuration, the data input is not delayed with respect to the data transmission.

As described above, according to the first embodiment, data transmission to the deflection control circuit 130 can be performed without any delay. Therefore, writing processing can be proceeded smoothly.

Embodiments have been explained referring to concrete examples as described above. However, the present invention is not limited to these specific examples. There have been described the cases in which each of the data transmission computer units 120a and b performs data input and data transmission of processing data for N DPB regions 31, N being greater than n, for example, and in which each of the data transmission computer units 120a and b performs data input and data transmission of processing data for n DPB regions 31, for example. However, it is not limited thereto. As long as it is pre-set n or more, the number of the DPB regions of processing data to be input and transmitted may be intermingled such as the case of n and the case of N more than n. What is necessary is that, only in the case of transmitting processing data for N DPB regions 31, N being greater than n, the data transmission processing should be divided into the first transmission processing of transmitting, in order, processing data for (N-n) DPB regions and the second transmission processing of transmitting processing data for the remaining n DPB regions after completing the first transmission processing. In the case of transmitting processing data for n DPB regions 31, only one data transmission processing should be performed. Then, only in the case of data input which is performed in parallel to the data transmission of transmitting processing data for N DPB regions 31, N being greater than n, no new data input should be performed after starting the second transmission processing.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a plurality of conversion processing units configured to perform data conversion processing in parallel for writing data, for each processing region obtained by virtually dividing a writing region of a target object into a plurality of processing regions;
first and second transmission units configured to perform a first transmission processing and a second transmission processing, where, in the first transmission processing, while one of the first and second transmission units is performing data transmission processing, an other one of the first and second transmission units inputs processing data for N processing regions more than pre-set n processing regions for which the data conversion processing has been performed, and while one of the first and second transmission units is performing data input processing, an other one of the first and second transmission units transmits processing data for (N-n) processing regions in order, and in the second transmission processing, processing data for remaining n processing regions are transmitted in order after the first transmission processing has been completed, where when one of the first and second transmission units performs the data input processing, the one starts inputting the processing data while an other one of the first and second transmission units is performing the first transmission processing, and does not input processing data for a new processing region after the second transmission processing has been started;
a deflection control circuit configured to control a deflection amount for deflecting a charged particle beam, based on processing data for each processing region transmitted from the first and second transmission units; and
a writing unit configured to write a pattern on the target object by deflecting the charged particle beam, based on the deflection amount,
wherein the n is set as a first value which is greater than a second value obtained by dividing a time taken for one data input processing from one or more of the plurality of conversion processing units to one of the first and second transmission units by a time taken for transmission of processing data for one processing region from an other one of the first and second transmission units to the deflection control circuit.

2. The apparatus according to claim 1, wherein the first and second transmission units alternately perform data input and data transmission repeatedly, where the first and second transmission units do not simultaneously perform the data input, nor they do not simultaneously perform the data transmission.

3. The apparatus according to claim 1, wherein the first value is an integer.

4. The apparatus according to claim 1, wherein the first value is an integer calculated by rounding up a value after a decimal point of the first value.

5. A charged particle beam writing apparatus comprising:
a plurality of conversion processing units configured to perform data conversion processing in parallel for writing data, for each processing region obtained by virtually dividing a writing region of a target object into a plurality of processing regions;
first and second transmission units configured to perform transmission processing, where, while one of the first and second transmission units is performing data transmission processing, an other one of the first and second transmission units inputs processing data for pre-set n or more processing regions whose writing processing order is sequential and for which the data conversion processing has been performed, and while one of the first and second transmission units is performing data input processing, an other one of the first and second transmission units transmits processing data for n or more processing regions whose writing processing order is sequential;
a deflection control circuit configured to control a deflection amount for deflecting a charged particle beam, based on processing data for each processing region transmitted in order from the first and second transmission units; and
a writing unit configured to write a pattern on the target object by deflecting the charged particle beam, based on the deflection amount,
wherein the n is set as a first value which is greater than a second value obtained by dividing time taken for one data input processing from one or more of the plurality of conversion processing units to one of the first and second transmission units by a time taken for transmission of processing data for one processing region from an other one of the first and second transmission units to the deflection control circuit.

6. The apparatus according to claim 5, wherein the first and second transmission units perform a first transmission processing and a second transmission processing, where, in the first transmission processing, when transmitting processing data for N processing regions more than the n processing regions, processing data for (N-n) processing regions, whose writing processing order is sequential, are transmitted in order, and in the second transmission processing, processing data for remaining n processing regions whose writing processing order is sequential are transmitted in order after the first transmission processing has been completed, and
when one of the first and second transmission units performs both the first transmission processing and the second transmission processing, and when an other one performs the data input processing, the other one starts inputting the processing data while the one is performing the first transmission processing, and does not input processing data for a new processing region after the second transmission processing has been started.

7. The apparatus according to claim 5, wherein the writing region of the target object is divided into a plurality of stripe regions in a strip-shaped manner, the writing unit performs writing processing for each of the plurality of stripe regions, the first and second transmission units each finish data input processing when inputting processing data for a processing region at an end of a stripe region concerned is completed, for each of the plurality of stripe regions, and the first and second transmission units each perform transmission processing even if a number of input processing data is less than n when transmitting the processing data for the processing region at the end of the stripe region concerned.

8. The apparatus according to claim 5, wherein the first and second transmission units alternately perform data input and data transmission repeatedly, where the first and second transmission units do not simultaneously perform the data input, nor they do not simultaneously perform the data transmission.

9. The apparatus according to claim 5, wherein the first value is an integer.

10. The apparatus according to claim 5, wherein the first value is an integer calculated by rounding up a value after a decimal point of the first value.

11. A charged particle beam writing method comprising:
performing data conversion processing in parallel for writing data for each processing region obtained by virtually dividing a writing region of a target object into a plurality of processing regions, by using a plurality of conversion processing units;
inputting processing data for $N_1$ processing regions more than pre-set n processing regions for which the data conversion processing has been performed, by a first transmission unit;
transmitting data to a deflection control circuit, where the transmitting includes a first transmission processing of transmitting processing data for $(N_1-n)$ processing regions in order, and a second transmission processing of transmitting processing data for remaining n processing regions in order after the first transmission processing has been completed, by the first transmission unit;
starting inputting processing data for $N_2$ processing regions more than pre-set n processing regions, for which the data conversion processing has been performed, while the first transmission processing is being performed by the first transmission unit, where the inputting is controlled not to input processing data for a new processing region after the second transmission processing has been started, by a second transmission unit;
transmitting data to the deflection control circuit, where the transmitting includes a first transmission processing of transmitting processing data for $(N_2-n)$ processing regions in order after the second transmission processing by the first transmission unit has been completed, and a second transmission processing of transmitting processing data for remaining n processing regions in order after the first transmission processing has been completed, by the second transmission unit; and
writing a pattern on the target object by deflecting a charged particle beam, based on processing data for each processing region transmitted from the first and second transmission units,
wherein the n is set as a first value which is greater than a second value obtained by dividing time taken for one data input processing from one or more of the plurality of conversion processing units to one of the first and second transmission units by a time taken for transmission of processing data for one processing region from an other one of the first and second transmission units to the deflection control circuit.

* * * * *